(12) United States Patent
Wu et al.

(10) Patent No.: US 10,692,908 B2
(45) Date of Patent: Jun. 23, 2020

(54) CMOS IMAGE SENSOR ENCAPSULATION STRUCTURE AND METHOD FOR MANUFACTURING THE SAME

(71) Applicant: Pioneer Materials Inc. Chengdu, Chengdu, Sichuan (CN)

(72) Inventors: Chen-Hsin Wu, Chengdu (CN);
Ti-Hsien Tai, Chengdu (CN);
Yu-Hsiang Pan, Chengdu (CN);
Liu-Yuh Lin, Chengdu (CN);
Liang-Chih Weng, Chengdu (CN);
Tzu-Huan Cheng, Chengdu (CN);
Hao-Che Liu, Chengdu (CN);
Chien-Chun Liu, Chengdu (CN);
Chien-Yao Huang, Chengdu (CN);
Leon A Chiu, Chengdu (CN);
Sau-Mou Wu, Chengdu (CN)

(73) Assignee: Pioneer Materials Inc. Chengdu, Chengdu (CN)

( * ) Notice: Subject to any disclaimer, the term of this patent is extended or adjusted under 35 U.S.C. 154(b) by 0 days.

(21) Appl. No.: 16/203,754

(22) Filed: Nov. 29, 2018

(65) Prior Publication Data
US 2019/0198545 A1 Jun. 27, 2019

(30) Foreign Application Priority Data
Dec. 22, 2017 (CN) .......................... 2017 1 1414838

(51) Int. Cl.
*H01L 27/146* (2006.01)
*H01L 23/00* (2006.01)

(52) U.S. Cl.
CPC ........ *H01L 27/14618* (2013.01); *H01L 24/17* (2013.01); *H01L 27/1469* (2013.01);
(Continued)

(58) Field of Classification Search
CPC ........... H01L 27/14618; H01L 27/1469; H01L 27/14627; H01L 27/14689;
(Continued)

(56) References Cited

U.S. PATENT DOCUMENTS

| 2008/0093696 A1* | 4/2008 | Takao | ................ H01L 27/14623 257/432 |
| 2009/0206434 A1* | 8/2009 | Hashimoto | ....... H01L 27/14623 257/432 |

(Continued)

*Primary Examiner* — Sitaramarao S Yechuri
(74) *Attorney, Agent, or Firm* — Berggren LLP

(57) ABSTRACT

A CMOS image sensor encapsulation structure and its manufacturing method, including: forming a blind hole in a combined layer formed by a first insulating layer and a wafer, a surface of the first insulating layer facing away from the wafer having a micro convex lens; forming a second insulating layer on a hole wall of the blind hole, then filling an electrically conductive material in the blind hole having the second insulating layer, and making a conductor in the combined layer in signal connection with the micro convex lens and an IC extend to a surface of the first insulating layer and electrically connecting the conductor to the electrically conductive material; fixing the transparent substrate material on a surface of the first insulating layer having the micro convex lens, forming a dummy wafer on a surface of the transparent substrate material, and then thinning the wafer by grinding.

19 Claims, 4 Drawing Sheets

(52) U.S. Cl.
CPC .. *H01L 27/14627* (2013.01); *H01L 27/14632* (2013.01); *H01L 27/14643* (2013.01); *H01L 27/14687* (2013.01); *H01L 27/14689* (2013.01)

(58) Field of Classification Search
CPC ......... H01L 27/14687; H01L 27/14643; H01L 27/14632; H01L 24/17
See application file for complete search history.

(56) References Cited

U.S. PATENT DOCUMENTS

| | | | |
|---|---|---|---|
| 2013/0264688 A1* | 10/2013 | Qian | H01L 24/80 257/622 |
| 2014/0014813 A1* | 1/2014 | Mao | H01L 27/14623 250/208.1 |
| 2015/0035104 A1* | 2/2015 | Horikoshi | H01L 27/14627 257/432 |
| 2016/0351604 A1* | 12/2016 | Kalnitsky | H01L 27/14689 |
| 2017/0287812 A1* | 10/2017 | Safran | H01L 23/481 |
| 2018/0040584 A1* | 2/2018 | Kang | H01L 27/14634 |
| 2019/0157322 A1* | 5/2019 | Li | H01L 27/1463 |
| 2019/0305049 A1* | 10/2019 | Park | H01L 27/14627 |

\* cited by examiner

CMOS IMAGE SENSOR ENCAPSULATION STRUCTURE AND METHOD FOR MANUFACTURING THE SAME

CROSS-REFERENCE TO RELATED APPLICATIONS

The present disclosure claims the priority to the Chinese patent application with the filing No. 201711414838.5, filed on Dec. 22, 2017 with the State Intellectual Property Office (SIPO) of the People's Republic of China, entitled "CMOS Image Sensor Encapsulation Structure and Method for Manufacturing the Same", which is incorporated herein by reference in its entirety.

TECHNICAL FIELD

The present disclosure relates to the technical field of image sensors, and particularly to a CMOS image sensor encapsulation structure and a method for manufacturing the same.

BACKGROUND ART

A CMOS (abbreviation of Complementary Metal-Oxide Semiconductor) sensor, which is a type of image sensor, is usually a core part of digital cameras.

Currently, conventional CMOS sensors have a problem that their encapsulation structures are relatively thick.

SUMMARY

An object of the present disclosure is to provide a method for manufacturing a CMOS image sensor encapsulation structure, by which a CMOS image sensor encapsulation structure having a relatively small thickness can be manufactured.

The other object of the present disclosure is to provide a CMOS image sensor encapsulation structure which is featured by having a small thickness.

The present disclosure is implemented as follows.

A method for manufacturing a CMOS image sensor encapsulation structure, comprising:

forming a blind hole in a combined layer formed by a first insulating layer and a wafer, wherein the blind hole passes through the first insulating layer with its hole bottom located on the wafer, and a surface of the first insulating layer facing away from the wafer has a micro convex lens; forming a second insulating layer on a hole wall of the blind hole, then filling an electrically conductive material in the blind hole having the second insulating layer, and making a conductor (wire) in the combined layer extend to a surface of the first insulating layer to be electrically connected to the electrically conductive material, with the conductor in signal connection with the micro convex lens and an IC; and fixing a transparent substrate material on a surface of the first insulating layer having the micro convex lens, fixing a dummy wafer on a surface of the transparent substrate material, and then thinning the wafer by grinding such that the electrically conductive material in the blind hole is exposed.

Furthermore, in an example of the present disclosure, the wafer before being thinned by grinding has a thickness of 700~1000 μm, and the wafer after being thinned by grinding has a thickness of 20~100 μm Furthermore, in an example of the present disclosure, the wafer after being thinned by grinding has a thickness of 40~70 μm.

Furthermore, in an example of the present disclosure, the electrically conductive material includes copper.

Furthermore, in an example of the present disclosure, the transparent substrate material is fixed to the surface of the first insulating layer by a light-transmissive adhesive glue.

Furthermore, in an example of the present disclosure, materials of the transparent substrate material include sapphire, quartz glass and magnesium oxide.

Furthermore, in an example of the present disclosure, areas where the micro convex lens and the blind hole are located are a first installation area and a second installation area, respectively, the first installation area and the second installation area do not overlap each other, and the transparent substrate material is provided in the first installation area.

Furthermore, in an example of the present disclosure, the transparent substrate material covers a whole surface of the combined layer.

Furthermore, in an example of the present disclosure, after the wafer is thinned by grinding, the method further includes: forming a third insulating layer on a surface of the wafer that is thinned by grinding such that the electrically conductive material is exposed, then forming metal projections on the third insulating layer and electrically connecting the metal projections to the electrically conductive material.

The present disclosure further provides a CMOS image sensor encapsulation structure, including:

a wafer;

a first insulating layer formed on a side of the wafer, wherein the first insulating layer and the wafer form a combined layer;

a plurality of micro convex lenses formed in the combined layer, a region in the combined layer where the micro convex lenses are formed form a first installation area, and a region in the combined layer other than the first installation area is a second installation area;

a transparent substrate material formed on a side of the first insulating layer, with the side away from the wafer, wherein the transparent substrate material at least covers the first installation area; the transparent substrate material is fixed on surfaces of the first insulating layer and the micro convex lenses by a high-light-transmittance adhesive glue, and a gap between the transparent substrate material and the first insulating layer is filled up with the high-light-transmittance adhesive glue;

an internal IC circuit formed in the combined layer, and an electrically conductive material formed in the second installation area, wherein the electrically conductive material passes through the combined layer, the electrically conductive material is electrically connected to the internal IC circuit and the micro convex lenses; and a second insulating layer is formed between the electrically conductive material and the combined layer.

Furthermore, the transparent substrate material covers a whole surface of the combined layer.

Furthermore, the CMOS image sensor encapsulation structure further includes: a dummy wafer formed on a side of the first insulating layer, with the side away from the wafer, wherein the dummy wafer is fixed to the transparent substrate material.

Furthermore, the dummy wafer is bond-fixed on a surface of the transparent substrate material by an adhesive glue, wherein a gap between the second installation area and the dummy wafer is filled up with the adhesive glue, such that the dummy wafer covers a surface of the whole combined layer.

Furthermore, the CMOS image sensor encapsulation structure further includes: a third insulating layer formed on a surface of a side of the wafer, with the side away from the first insulating layer.

Furthermore, the CMOS image sensor encapsulation structure further includes: a plurality of metal projections formed on a side of the wafer, with the side away from the first insulating layer, wherein two metal projections among the plurality of metal projections pass through the third insulating layer to be electrically connected to the electrically conductive material.

Furthermore, the CMOS image sensor encapsulation structure further includes: solder balls formed on a side of the metal projections away from the wafer.

Furthermore, the wafer has a thickness of 20~100 μm.

The present disclosure has the following beneficial effects: with the method for manufacturing a CMOS image sensor encapsulation structure provided in the examples of the present disclosure, in the process of manufacturing the CMOS image sensor encapsulation structure, firstly, the transparent substrate material is fixed to the surface of the first insulating layer, with the surface having the micro convex lens, the dummy wafer is fixed on the surface of the transparent substrate material, and then the wafer is thinned by grinding, and in this process, the transparent substrate material provides more mechanical support force for the wafer, therefore, the wafer can become thinner by grinding, thus the CMOS image sensor encapsulation structure is characterized in that the structure is formed in a thin shape. Moreover, in the manufacture process, the transparent substrate material is manufactured in a semiconductor factory, thus the cleanliness is higher, and pollution to the CMOS image sensor encapsulation structure can be avoided.

BRIEF DESCRIPTION OF DRAWINGS

In order to more clearly illustrate technical solutions of embodiments of the present disclosure, accompanying drawings which are needed for description of the embodiments will be introduced briefly below. It should be understood that the accompanying drawings below merely show some examples of the present disclosure, and therefore should not be considered as limiting the scope. A person ordinarily skilled in the art still can obtain other relevant drawings according to these accompanying drawings, without using inventive effort.

Figure 1:
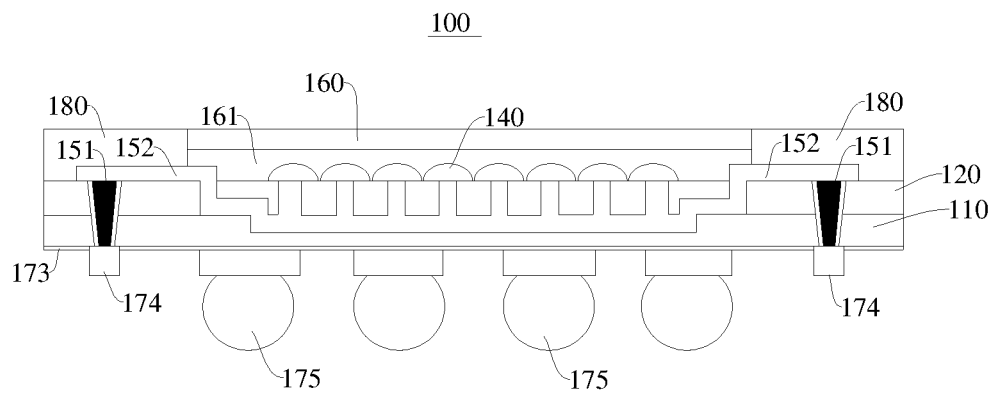
FIG. 1 is a schematic structural diagram of a CMOS image sensor encapsulation structure provided in an example of the present disclosure.

Reference signs: 100—CMOS image sensor encapsulation structure; 110—wafer; 120—first insulation layer; 130—blind hole; 140—micro convex lens; 150—second insulating layer; 151—electrically conductive material; 152—conductor; 160—transparent substrate material; 161—high-light-transmittance adhesive glue; 170—dummy wafer; 171—first installation area; 172—second installation area; 173—third insulating layer; 174—metal projection; 175—solder ball.

DETAILED DESCRIPTION OF EMBODIMENTS

In order to make the objects, technical solutions and advantages of the embodiments of the present disclosure clearer, below the technical solutions in the embodiments of the present disclosure will be described clearly and completely in conjunction with the accompanying drawings in the embodiments of the present disclosure. Apparently, some but not all embodiments of the present disclosure are described. Based on the embodiments of the present disclosure, all the other embodiments, obtained by a person ordinarily skilled in the art without paying inventive effort, should fall within the scope of protection of the present disclosure Therefore, the detailed description below of the embodiments of the present disclosure provided in the accompanying drawings is not intended to limit the scope of protection of the present disclosure, but merely represents chosen embodiments of the present disclosure. Based on the embodiments in the present disclosure, all the other embodiments, which a person ordinarily skilled in the art obtains without using inventive effort, fall within the scope of protection of the present disclosure.

It should be noted that similar reference signs and letters represent similar items in the following accompanying drawings. Therefore, once a certain item is defined in one accompanying drawing, it is not needed to be further defined or explained in subsequent accompanying drawings.

In the description of the present disclosure, it should be understood that orientational or positional relations indicated by terms "thickness", "upper", "lower", and so on are based on orientational or positional relations as shown in the accompanying drawings, merely for facilitating describing the present disclosure and simplifying the description, rather than indicating or implying that related devices or elements have to be in the specific orientation or configured and operated in the specific orientation, and therefore, they should not be construed as limiting the present disclosure.

Besides, terms "first", "second", and "third" are merely for descriptive purpose, and should not be construed as indicating or implying relative importance or implicitly indicating the number of a related technical feature. Thus, for a feature defined with "first", "second", or "third", it may explicitly or implicitly indicate that one or more such features are included.

In the present disclosure, unless otherwise specified and defined explicitly, terms "install", "provide", "fix", and so on should be construed in a broad sense. For example, a connection can be a fixed connection, a detachable connection, or an integrated connection; it can be a direct connection, an indirect connection via an intermediate medium, or an internal communication between two elements or an interaction relation between two elements. For a person ordinarily skilled in the art, specific meanings of the above-mentioned terms in the present disclosure can be understood according to specific circumstances.

The examples of the present disclosure provide a method for manufacturing a CMOS image sensor encapsulation structure 100. The CMOS image sensor encapsulation structure 100 manufactured by this method is characterized in that the structure is formed in a thin shape, referring to FIG. 1. Moreover, in a manufacture process, a transparent substrate material 160 is manufactured in a semiconductor factory, thus the cleanliness is higher, and pollution to the CMOS image sensor encapsulation structure 100 can be avoided.

Figure 2A:
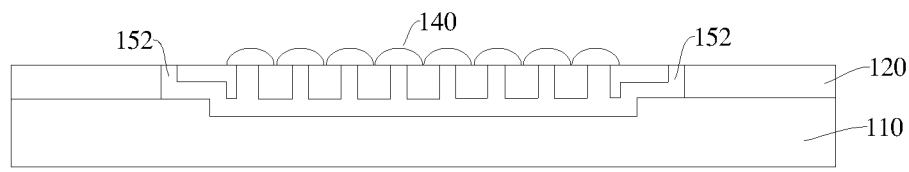
FIG. 2A is a schematic structural diagram of the CMOS image sensor encapsulation structure initially used when Step S1 is carried out in a method for manufacturing a CMOS image sensor encapsulation structure provided in an example of the present disclosure.
Figure 2B:
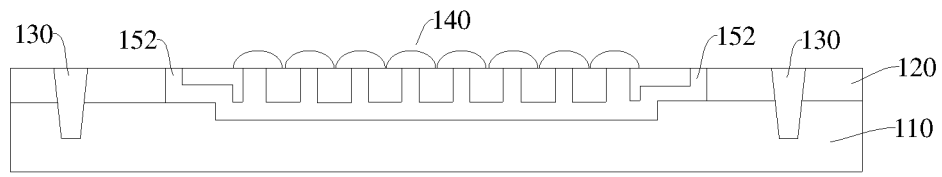
FIG. 2B is a schematic structural diagram after a blind hole is formed in a combined layer when the Step S1 is carried out in the method for manufacturing a CMOS image sensor encapsulation structure provided in the example of the present disclosure.

Specifically, the method for manufacturing a CMOS image sensor encapsulation structure 100 includes the following steps:

S1: referring to FIG. 1, FIG. 2A, and FIG. 2B, a blind hole 130 is formed in a combined layer formed by a first insulating layer 120 and a wafer 110. The blind hole 130 passes through the first insulating layer 120 with its hole bottom located on the wafer 110. A surface of the first insulating layer 120 facing away from the wafer 110 has a micro convex lens 140.

Figure 3A:
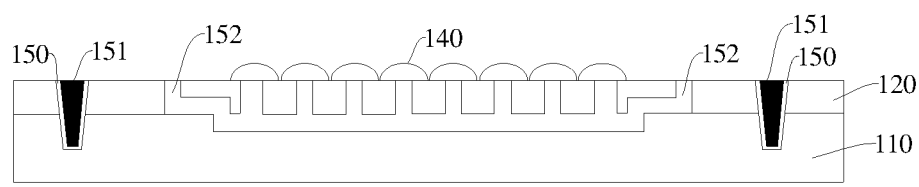
FIG. 3A is a schematic structural diagram after an electrically conductive material is filled in the blind hole having a second insulating layer when Step S2 is carried out in the method for manufacturing a CMOS image sensor encapsulation structure provided in the example of the present disclosure.
Figure 3B:
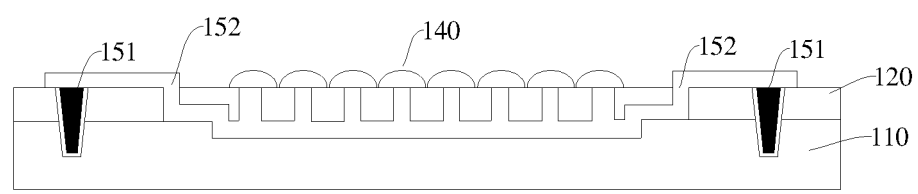
FIG. 3B is a schematic structural diagram after a conductor in the combined layer in signal connection with a micro convex lens and an IC to a surface of a first insulating layer and electrically connected to an electrically conductive material when Step S2 is carried out in the method for manufacturing a CMOS image sensor encapsulation structure provided in the example of the present disclosure.

S2: referring to FIG. 3A and FIG. 3B, a second insulating layer 150 is formed on a hole wall of the blind hole 130, then an electrically conductive material 151 is filled in the blind hole 130 having the second insulating layer 150, and a conductor 152 in the combined layer is guided to a surface of the first insulating layer 120 and electrically connected to the electrically conductive material 151, with the conductor in signal connection with the micro convex lens 140 and an IC.

It should be indicated that a position of the IC (internal elements and circuits) in the combined layer should be located above a bottom portion of the blind hole 130, in this way, damage to the IC in the combined layer can be avoided when the wafer 110 is thinned by grinding in a subsequent procedure.

Furthermore, the second insulating layer 150 is formed on the hole wall of the blind hole 130 by deposition. Besides, in a process of being formed on the hole wall of the blind hole 130, the second insulating layer 150 also may be formed on the hole bottom of the blind hole 130, but the second insulating layer 150 formed on the hole bottom of the blind hole 130 finally will be ground off. Therefore, it is just needed to ensure that the second insulating layer 150 is formed on the hole wall of the blind hole 130.

Furthermore, in the present example, the electrically conductive material 151 includes copper. In other examples, the electrically conductive material 151 also can be silver, gold, aluminum, and so on. As copper is relatively cheap, and has relatively good electrical conductivity, copper is selected as the electrically conductive material 151 in the present example.

Figure 4A:
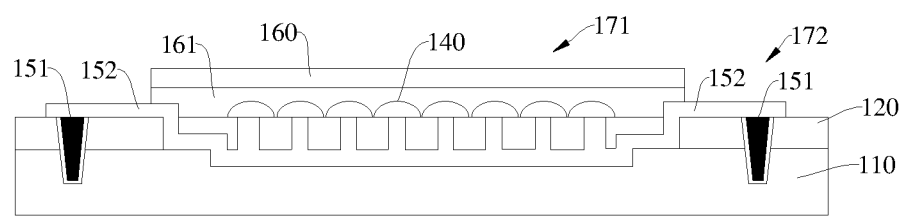
FIG. 4A is a schematic structural diagram after a transparent substrate material is fixed to a surface of the first insulating layer when Step S3 is carried out in the method for manufacturing a CMOS image sensor encapsulation structure provided in the example of the present disclosure.
Figure 4B:
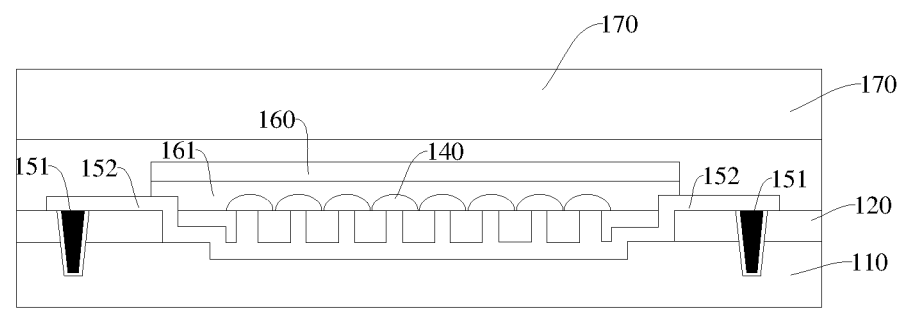
FIG. 4B is a schematic structural diagram after a dummy wafer is fixed to a surface of the transparent substrate material when the Step S3 is carried out in the method for manufacturing a CMOS image sensor encapsulation structure provided in the example of the present disclosure.
Figure 4C:
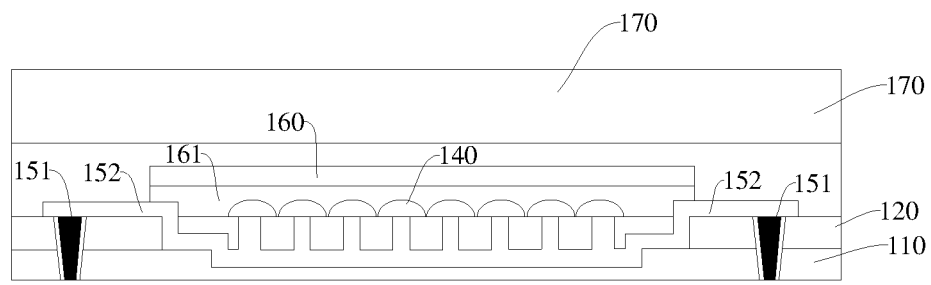
FIG. 4C is a schematic structural diagram after a wafer is thinned by grinding when Step S3 is carried out in the method for manufacturing a CMOS image sensor encapsulation structure provided in the example of the present disclosure.
Figure 5A:
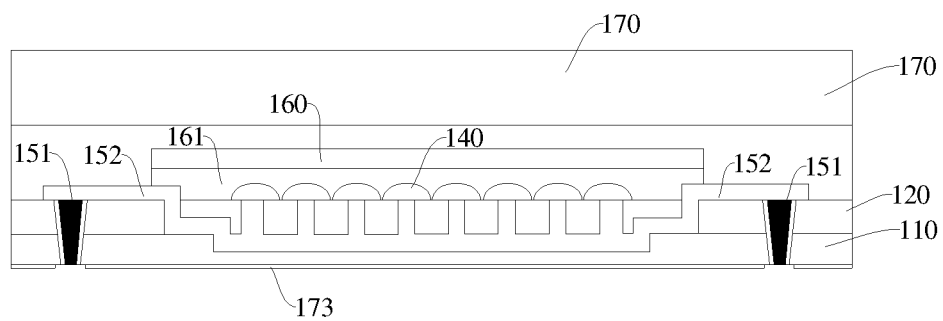
FIG. 5A is a schematic structural diagram after a third insulating layer is formed on a surface of the wafer that is thinned by grinding and the electrically conductive material is exposed when Step S4 is carried out in the method for manufacturing a CMOS image sensor encapsulation structure provided in the example of the present disclosure.
Figure 5B:
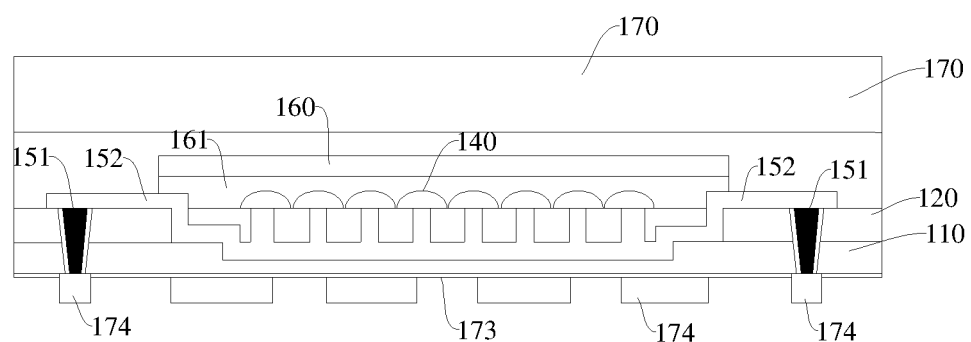
FIG. 5B is a schematic structural diagram after metal projections are formed on the third insulating layer and are electrically connected to the electrically conductive material when the Step S4 is carried out in the method for manufacturing a CMOS image sensor encapsulation structure provided in the example of the present disclosure.
Figure 5C:
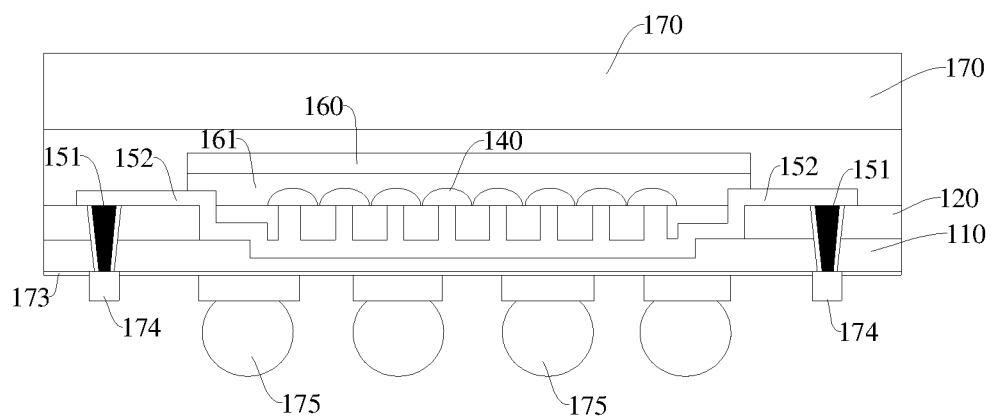
FIG. 5C is a schematic structural diagram after solder balls are welded on the metal projections when Step S4 is carried out in the method for manufacturing a CMOS image sensor encapsulation structure provided in the example of the present disclosure.
Figure 5D:
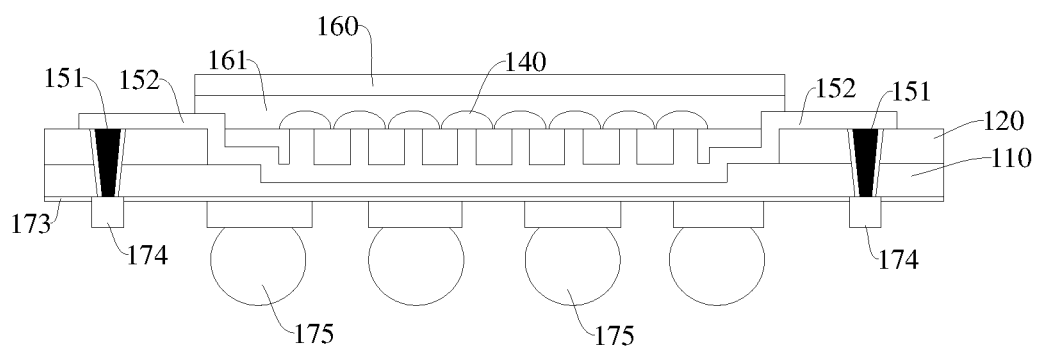
FIG. 5D is a schematic structural diagram after the dummy wafer is removed when Step S4 is carried out in the method for manufacturing a CMOS image sensor encapsulation structure provided in the example of the present disclosure.

S3: referring to FIG. 4A-FIG. 4C, the transparent substrate material 160 is fixed on a surface of the first insulating layer 120, with the surface having the micro convex lens 140, a dummy wafer 170 is fixed on a surface of the transparent substrate material 160, and then the wafer 110 is thinned by grinding such that the electrically conductive material 151 in the blind hole 130 is exposed.

The transparent substrate material 160 is fixed on the surface of the first insulating layer 120, with the surface having the micro convex lens 140, and the transparent substrate material 160 can transmit light into the micro convex lens 140. The dummy wafer 170 is used to connect a CMP (Chemical Mechanical Polishing) grinding head, and the CMP grinding head is used to perform a process of thinning the wafer 110 by grinding. Since the transparent substrate material 160 can provide more mechanical support for the combined layer, when the wafer 110 is thinned by grinding, the wafer 110 can become thinner by grinding.

Furthermore, in the present example, the wafer 110 before being thinned by grinding has a thickness of 700~1000 μm, the wafer 110 after being thinned by grinding has a thickness of 20~100 μm, or the wafer 110 after being thinned by grinding has a thickness of 40~70 μm.

Furthermore, materials of the transparent substrate material 160 include sapphire, quartz glass and magnesium oxide. All of these materials are featured by relatively good light transmittance, and then by using them as the transparent substrate material 160, light can better pass through the transparent substrate material 160 to be received by the micro convex lens 140.

Furthermore, the transparent substrate material 160 is fixed to the surface of the first insulating layer 120 by a light-transmissive adhesive glue. In the present example, the light-transmissive adhesive glue is a high-light-transmittance adhesive glue 161. The high-light-transmittance adhesive glue 161 not only can ensure reliability of connection of the transparent substrate material 160 to the first insulating layer 120 and to the micro convex lens 140, but also will not hinder light from passing through the transparent substrate material 160 to enter the micro convex lens 140. Besides, in the present example, the high-light-transmittance adhesive glue 161 can contact a whole surface of the transparent substrate material 160, that is, a gap between the transparent substrate material 160 and the first insulating layer 120 is filled up with the high-light-transmittance adhesive glue 161, in this way, it can be ensured that there are more contact points between the transparent substrate material 160 and the combined layer, thus a sufficient support force can be provided when the wafer 110 is thinned by grinding.

Furthermore, in the present example, areas where the micro convex lens 140 and the blind hole 130 are located are a first installation area 171 and a second installation area 172, respectively. The first installation area 171 and the second installation area 172 do not overlap each other. The transparent substrate material 160 is provided in the first installation area 171. The first installation area 171 is located in a middle region of the combined layer, and the second installation area 172 is located in an edge region of the combined layer. Such arrangement benefits subsequent cutting.

Besides, in the present example, the dummy wafer 170 is bonded by an adhesive glue, so as to be fixed on the surface of the transparent substrate material 160. The second installation area 172 is also filled with the adhesive glue, such that the dummy wafer 170 covers the whole combined layer.

It should be indicated that in other examples, it also can be provided that the transparent substrate material 160 covers the whole surface of the combined layer.

S4: referring to FIG. 5A-FIG. 5D, after the wafer 110 is thinned by grinding, a third insulating layer 173 is formed on a surface of the wafer 110 that is thinned by grinding and the electrically conductive material 151 is exposed, then metal projections 174 are formed on the third insulating layer 173 and electrically connected to the electrically conductive material 151. Solder balls 175 are welded on the metal projections 174, and then the dummy wafer 170 is removed.

Furthermore, after the third insulating layer 173 is formed on the surface of the wafer 110 that is thinned by grinding, the third insulating layer 173 in a region corresponding to the electrically conductive material 151 is removed such that the electrically conductive material 151 is exposed, then a part of the metal projections 174 are formed at the electrically conductive material 151 and electrically connected to the electrically conductive material 151, and the other part of metal projections 174 are formed on a surface of the third insulating layer 173 and electrically connected to the metal projections 174 formed at the electrically conductive material 151, such that the metal projections 174 on the third insulating layer 173 are electrically connected to the electrically conductive material 151. Furthermore, a circuit in the IC (internal elements and circuits) can be guided out to the metal projections 174. The solder balls 175 are welded on the metal projections 174. An electrical signal of a chip can be connected to a system base board via the solder balls 175.

Furthermore, in the present example, the first insulating layer 120, the second insulating layer 150, and the third insulating layer 173 can be $SiO_2$, $Si_3N_4$, BPGS (BSG borosilicate glass, borophosphate glass), an organic resin or a mixture of organic resin and inorganic resin.

Since in the process of manufacturing the CMOS image sensor encapsulation structure 100, firstly, the transparent substrate material 160 is fixed to the surface of the first insulating layer 120, with the surface having the micro convex lens 140, the dummy wafer 170 is formed on the surface of the transparent substrate material 160, and then the wafer 110 is thinned by grinding, and in this process, the transparent substrate material 160 provides more mechanical support force for the wafer 110, therefore, the wafer 110 can become thinner by grinding, thus the CMOS image sensor encapsulation structure 100 is characterized in that the structure is formed in a thin shape. Moreover, in the manufacture process, the transparent substrate material 160 is manufactured in a semiconductor factory, thus the cleanliness is higher, and pollution to the CMOS image sensor encapsulation structure 100 can be avoided.

The example of the present disclosure further provide a CMOS image sensor encapsulation structure 100, again as shown in FIG. 1, including a wafer 110, a first insulating layer 120, a micro convex lens 140, a transparent substrate material 160, a high-light-transmittance adhesive glue 161, an internal IC circuit, and an electrically conductive material 151.

Specifically, a material and a dimension of the wafer 110 can be determined according to practical requirements.

The first insulating layer 120 is formed on a side of the wafer 110, and the first insulating layer 120 and the wafer 110 form a combined layer. A material of the first insulating layer 120 can be one or more selected from the group consisting of $SiO_2$, $Si_3N_4$, BPGS (BSG borosilicate glass, borophosphate glass), an organic resin and a mixture of organic resin and inorganic resin. The specific material of the first insulating layer 120 is not limited in the present disclosure.

The micro convex lens 140 is formed in the combined layer. A region in the combined layer where the micro convex lens 140 is formed forms a first installation area 171. A region in the combined layer other than the first installation area 171 is a second installation area 172.

The number of the micro convex lens 140 can be in plurality. A plurality of micro convex lenses 140 form a lens array. The micro convex lens 140 can converge light and then transmit the light into the internal IC circuit.

The transparent substrate material 160 is formed on a side of the first insulating layer 120, with the side away from the wafer 110, wherein the transparent substrate material 160 at least covers the first installation area 171. The transparent substrate material 160 is fixed on surfaces of the first insulating layer 120 and the micro convex lens 140 by a high-light-transmittance adhesive glue 161. A gap between the transparent substrate material 160 and the first insulating layer 120 is filled up with the high-light-transmittance adhesive glue 161. It can be understood that the transparent substrate material 160 can merely cover the surface of the micro convex lens 140, and also can cover a whole surface of the combined layer, that is, cover the surfaces of the micro convex lens 140 and the first insulating layer 120. Materials of the transparent substrate material 160 can include sapphire, quartz glass and magnesium oxide. All of these materials are featured by relatively good light transmittance, and then external light can better pass through the transparent substrate material 160 to be received by the micro convex lens 140.

When the transparent substrate material and the micro convex lens 140 are fixed with each other, all gaps between the transparent substrate material 160 and the micro convex lens 140 can be filled up with the high-light-transmittance adhesive glue 161, such that there are more contact points between the transparent substrate material 160 and the combined layer, thus a stronger support force can be provided when the wafer 110 is being thinned.

The internal IC circuit is formed in the combined layer. The electrically conductive material 151 is formed in the second installation area 172. The electrically conductive material 151 passes through the combined layer. The electrically conductive material 151 is electrically connected to the internal IC circuit and the micro convex lens 140. A second insulating layer 150 is formed between the electrically conductive material 151 and the combined layer. The electrically conductive material 151 can be connected to the internal IC circuit via a conductor. One end of the electrically conductive material 151 is connected to the internal IC circuit, with the end located at the side of the first insulating layer 120, and the other end is provided on a surface of the wafer 110 away from the first insulating layer 120. A detailed method for manufacturing the electrically conductive material 151 can be referred to the above example of method, and it will not be repeated redundantly herein.

The electrically conductive material 151 can include copper. In other examples, the electrically conductive material 151 also can be silver, gold, aluminum, and so on. Materials of the second insulating layer 150 can be one or more selected from the group consisting of $SiO_2$, $Si_3N_4$, BPGS (BSG borosilicate glass, borophosphate glass), an organic resin and a mixture of organic resin and inorganic resin. The specific material of the second insulating layer 150 is not limited in the present disclosure.

In another embodiment, this CMOS image sensor encapsulation structure 100 further includes a dummy wafer 170 formed on a side of the first insulating layer 120, with the side away from the wafer 110, wherein the dummy wafer 170 is fixed to the transparent substrate material 160. The dummy wafer 170 is used to be connected a CMP grinding head, wherein the CMP grinding head is used to perform a process of thinning the wafer 110 by grinding. Since the transparent substrate material 160 can provide more mechanical support force for the combined layer, when the wafer 110 is thinned by grinding, the wafer 110 can become thinner by grinding.

In an example of the present disclosure, the wafer 110 can have a thickness of 20~100 μm. The wafer 110 with such thickness is obtained by grinding the original wafer 110 to make it thinner, after the dummy wafer 170 is already formed.

The dummy wafer 170 is bond-fixed on a surface of the transparent substrate material 160 by an adhesive glue, wherein a gap between the second installation area 172 and the dummy wafer 170 is filled up with the adhesive glue, such that the dummy wafer 170 covers a surface of the whole combined layer.

In another embodiment, this CMOS image sensor encapsulation structure 100 further includes a third insulating layer 173 formed on a surface of a side of the wafer 110, with the side away from the first insulating layer 120. A material of the third insulating layer 173 can be one or more selected from the group consisting of $SiO_2$, $Si_3N_4$, BPGS (BSG borosilicate glass, borophosphate glass), an organic resin and a mixture of organic resin and inorganic resin. The specific material of the third insulating layer 173 is not limited in the present disclosure.

In another embodiment, this CMOS image sensor encapsulation structure 100 further includes a plurality of metal projections 174 formed on a side of the wafer 110, with the side away from the first insulating layer 120. Two metal projections 174 among the plurality of metal projections 174 pass through the third insulating layer 173 to be electrically connected to the electrically conductive material 151. A part of the metal projections 174 are located on a surface of the third insulating layer 173, and two of the metal projections 174 are directly connected to the electrically conductive material 151.

In another embodiment, this CMOS image sensor encapsulation structure 100 further includes solder balls 175 formed on a side of the metal projections 174, with the side away from the wafer 110. With the solder balls 175, an electrical signal of a chip can be connected to a system base board.

For the CMOS image sensor encapsulation structure 100 provided in the examples of the present disclosure, the transparent substrate material 160 is fixed on the surface of the first insulating layer 120, with the surface having the micro convex lens 140, such that the transparent substrate material 160 can provide a surface for fixing the dummy wafer 170. With such a structure, when an operation of thinning the wafer 110 by grinding is carried out, the transparent substrate material 160 can provide more mechanical support force for the wafer 110, such that the wafer 110 can become thinner by grinding, thus the CMOS image sensor encapsulation structure 100 is characterized in that the structure is formed in a thin shape.

The above-mentioned are merely for preferred embodiments of the present disclosure and are not intended to limit the present disclosure. For a person skilled in the art, various modifications and changes may be made to the present disclosure. Any amendments, equivalent replacements, improvements and so on, within the spirit and principle of the present disclosure, shall be covered by the scope of protection of the present disclosure.

INDUSTRIAL APPLICABILITY

The present disclosure provides a CMOS image sensor encapsulation structure and a method for manufacturing the same. By fixing the transparent substrate material on the surface of the first insulating layer, with the surface having the micro convex lens, the transparent substrate material can provide a surface for fixing the dummy wafer. With such a structure, when the operation of thinning the wafer by grinding is carried out, the transparent substrate material can provide more mechanical support forces for the wafer, such that the wafer can become thinner by grinding, thus the CMOS image sensor encapsulation structure is characterized in that the structure is formed in a thin shape.

What is claimed is:

1. A method for manufacturing a CMOS image sensor encapsulation structure, comprising:
    forming a blind hole in a combined layer formed by a first insulating layer and a wafer, wherein the blind hole passes through the first insulating layer with its hole bottom located on the wafer, and a surface of the first insulating layer facing away from the wafer has a micro convex lens;
    forming a second insulating layer on a hole wall of the blind hole, then filling an electrically conductive material in the blind hole having the second insulating layer, and making a conductor in the combined layer extend to a surface of the first insulating layer to be electrically connected to the electrically conductive material, with the conductor in signal connection with the micro convex lens and an IC; and
    fixing a transparent substrate material on a surface of the first insulating layer, with the surface having the micro convex lens, forming a dummy wafer on a surface of the transparent substrate material, and then thinning the wafer by grinding such that the electrically conductive material in the blind hole is exposed, wherein the dummy wafer is formed on a side of the first insulating layer, with the side away from the wafer, and the dummy wafer is fixed to the transparent substrate material.

2. The method for manufacturing a CMOS image sensor encapsulation structure of claim 1, wherein the wafer before being thinned by grinding has a thickness of 700~1000 μm, and the wafer after being thinned by grinding has a thickness of 20~100 μm.

3. The method for manufacturing a CMOS image sensor encapsulation structure of claim 2, wherein the wafer after being thinned by grinding has a thickness of 40~70 μm.

4. The method for manufacturing a CMOS image sensor encapsulation structure of claim 1, wherein the electrically conductive material is one or more selected from the group consisting of copper, silver, aluminum and gold.

5. The method for manufacturing a CMOS image sensor encapsulation structure of claim 1, wherein the transparent substrate material is fixed to the surface of the first insulating layer by a light-transmissive adhesive glue.

6. The method for manufacturing a CMOS image sensor encapsulation structure of claim 5, wherein materials of the transparent substrate material include sapphire, quartz glass and magnesium oxide.

7. The method for manufacturing a CMOS image sensor encapsulation structure of claim 1, wherein materials of the transparent substrate material include sapphire, quartz glass and magnesium oxide.

8. The method for manufacturing a CMOS image sensor encapsulation structure of claim 1, wherein areas where the micro convex lens and the bond hole are located are a first installation area and a second installation area, respectively, the first installation area and the second installation area do not overlap each other, and the transparent substrate material is provided in the first installation area.

9. The method for manufacturing a CMOS image sensor encapsulation structure of claim 1, wherein the transparent substrate material covers a whole surface of the combined layer.

10. The method for manufacturing a CMOS image sensor encapsulation structure of claim 1, wherein after the wafer is thinned by grinding, the method further comprises:

forming a third insulating layer on a surface of the wafer that is thinned by grinding such that the electrically conductive material is exposed; and forming metal projections on the third insulating layer and electrically connecting the metal projections to the electrically conductive material.

11. A CMOS image sensor encapsulation structure, comprising:

a wafer;

a first insulating layer formed on a side of the wafer, wherein the first insulating layer and the wafer form a combined layer;

a plurality of micro convex lenses formed in the combined layer, wherein a region in the combined layer where the micro convex lenses are formed forms a first installation area, and a region in the combined layer other than the first installation area is a second installation area;

a transparent substrate material formed on a side of the first insulating layer, with the side away from the wafer, wherein the transparent substrate material at least covers the first installation area; the transparent substrate material is fixed on surfaces of the first insulating layer and the micro convex lenses by a high-light-transmittance adhesive glue, and a gap between the transparent substrate material and the first insulating layer is filled up with the high-light-transmittance adhesive glue;

an internal IC circuit formed in the combined layer, and an electrically conductive material formed in the second installation area, wherein the electrically conductive material passes through the combined layer, the electrically conductive material is electrically connected to the internal IC circuit and the micro convex lenses; and a second insulating layer is formed between the electrically conductive material and the combined layer, wherein the CMOS image sensor encapsulation structure further comprises a dummy wafer formed on a side of the first insulating layer, with the side away from the wafer, and the dummy wafer is fixed to the transparent substrate material.

12. The CMOS image sensor encapsulation structure of claim 11, wherein the transparent substrate material covers a whole surface of the combined layer.

13. The CMOS image sensor encapsulation structure of claim 11, wherein the dummy wafer is bond-fixed on a surface of the transparent substrate material by an adhesive glue, wherein a gap between the second installation area and the dummy wafer is filled up with the adhesive glue, such that the dummy wafer covers a surface of the whole combined layer.

14. The CMOS image sensor encapsulation structure of claim 13, further comprising: a third insulating layer formed on a surface of a side of the water, with the side away from the first insulating layer.

15. The CMOS image sensor encapsulation structure of claim 11, further comprising: a third insulating layer formed on a surface of a side of the wafer, with the side away from the first insulating layer.

16. The CMOS image sensor encapsulation structure of claim 15, further comprising: a plurality of metal projections formed on a side of the wafer facing away from the first insulating layer, wherein two metal projections among the plurality of metal projections pass through the third insulating layer to be electrically connected to the electrically conductive material.

17. The CMOS image sensor encapsulation structure of claim 16, further comprising: solder balls formed on a side of the metal projections, with the side away from the wafer.

18. The CMOS image sensor encapsulation structure of claim 11, wherein the wafer has a thickness of 20~100 μm.

19. The CMOS image sensor encapsulation structure of claim 11, further comprising: a third insulating layer formed on a surface of a side of the wafer, with the side away from the first insulating layer.

* * * * *